United States Patent
Kash et al.

(10) Patent No.: US 6,496,022 B1
(45) Date of Patent: *Dec. 17, 2002

(54) METHOD AND APPARATUS FOR REVERSE ENGINEERING INTEGRATED CIRCUITS BY MONITORING OPTICAL EMISSION

(75) Inventors: Jeffrey A. Kash, Pleasantville, NY (US); James C. Tsang, White Plains, NY (US); Daniel R. Knebel, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/468,999

(22) Filed: Dec. 21, 1999

(51) Int. Cl.[7] .............................................. G01R 31/302
(52) U.S. Cl. ....................................................... 324/752
(58) Field of Search ................................ 324/537, 752; 382/141, 145, 146, 147; 348/86, 87, 91, 92

(56) References Cited

U.S. PATENT DOCUMENTS

| | | | |
|---|---|---|---|
| 5,940,545 A | * | 8/1999 | Kash et al. .................. 324/501 |
| 6,028,952 A | | 2/2000 | Kash et al. |
| 6,172,512 B1 | * | 1/2001 | Evans et al. ................. 324/752 |

OTHER PUBLICATIONS

IEEE E.D. Letters, Jul. 1997, Kash et al.*
Kash et al., "Dynamic Internal Testing of CMOS Circuits Using Hot Luminescence", IEEE Electron Device Letters, vol. 18, No. 7, Jul. 1997, pp. 330–332.

* cited by examiner

Primary Examiner—N. Le
Assistant Examiner—Etienne P. LeRoux
(74) Attorney, Agent, or Firm—Fleit, Kain, GIbbons, Gutman & Bongini P.L.; Jose Gutman; Casey P. August

(57) ABSTRACT

A method and apparatus for reverse engineering an integrated circuit chip (IC chip) (120) utilizes an electrical circuit tester (114) for injecting a triggering signal into the IC chip (120) to exercise a circuit under test. In synchronization thereto, a PICA detector (116) monitors optical emissions from the circuit under test. A spatial data extractor, electrically coupled to the PICA detector, collects space information (124) from patterns of light emissions emitted by the circuit under test, and a timing data extractor, electrically coupled to the electrical circuit tester and to the PICA detector (116), collects time information (126) from the patterns of light emissions emitted by the circuit under test. A database memory (105) includes known data about the circuit under test and also includes at least one reference pattern for comparing a captured light emission pattern thereto to identify at least one circuit element in the circuit under test. A PICA data analyzer (108), electrically coupled to the database memory (105) and to the PICA detector (116), determines at least one of whether the circuit under test comprises a circuit element with a light emission pattern that matches one of the at least one reference pattern in the database memory (105), and the value contained in a memory in the IC chip (120).

8 Claims, 3 Drawing Sheets

METHOD AND APPARATUS FOR REVERSE ENGINEERING INTEGRATED CIRCUITS BY MONITORING OPTICAL EMISSION

BACKGROUND OF THE INVENTION

1. Field of the Invention

This invention relates in general to non-destructive reverse engineering of integrated circuits, and more particularly to a method and apparatus for non-destructive reverse engineering of integrated circuits by analyzing their optical emissions.

2. Description of the Prior Art

The term "reverse engineering" has the general meaning of understanding how any item operates or was constructed, based mainly on knowing the general function of the item and any information that can be learned by direct examination of the item itself. Reverse engineering is considered "non-destructive" if the item is still functional at the end of the reverse engineering process.

Conventional methods of reverse engineering are usually physical methods that are often destructive of an integrated circuit (IC) chip. Often these methods require unpackaging, and sometimes at least partially dissecting, the IC chip, making it very difficult to use the IC chip afterwards. Further, these prior art methods typically involve significant manual intervention by technical personnel. In the case of static memory circuits such as Flash ROM, these prior art methods are incapable of detecting the contents of the memory. In addition, the methods can be tedious and inefficient.

The least destructive, or non-destructive, methods for reverse engineering, such as looking at power consumption or looking at RF emissions from an IC chip, normally have no spatial resolution. Therefore, they usually cannot provide information about either the physical location of subcircuits of the chip or the device-level schematic of the transistors comprising each subcircuit. Such methods are normally successful only when used to reverse engineer relatively simple chips, or a subcircuit of a more is complex chip which is known to be operable in isolation from the rest of the subcircuits of the chip. Consequently, reverse engineering a complex IC chip without spatial information about specific devices that are in close proximity to each other on the IC chip can be very difficult with these methods. The addition of such spatial information will improve both the speed and the accuracy of the reverse engineering process. Additionally, conventional techniques are readily defeated by a number of simple countermeasures that are well known.

Other potential methods of reverse engineering, such as single point probing with an electron beam (with for example an electron beam circuit tester like the Schlumberger ATE model IDS10000) can provide information about the functioning of individual transistors. However, the inability to probe more than a single device simultaneously can make reverse engineering by any single point probe method extremely time consuming, and hence, impractical. In addition, with modern "flip-chip" ICs, preparing the chip for probing may require depackaging and removal of passivation or wiring layers, and is essentially destructive of the chip.

Accordingly, there is a need for a method and apparatus to eliminate those specific disadvantages of the prior art reverse engineering systems as discussed above, and particularly to significantly enhance the ability of a reverse engineering system to non-destructively create a model of a circuit, active devices, and static states internal to an IC chip.

DESCRIPTION OF A PREFERRED EMBODIMENT

The present invention allows non-destructive reverse engineering by monitoring induced light emissions from active elements in an integrated circuit (IC) chip. Generally, light emissions from active elements can be monitored using methods and apparatus that have been taught in the following identified co-pending patent applications, the first one being numbered 08/683,837, entitled "Noninvasive optical method for measuring internal switching and other dynamic parameters of CMOS circuits", filed on Jul. 18, 1996, by inventors Kash et al., and the second one being numbered 09/026,063, entitled "System and method for compressing analyzing time-resolved optical data obtained from operating integrated circuits", filed on Feb. 19, 1998, by inventors Kash et al., and which are both owned by the assignee of the present invention, and the teachings of which are incorporated herein by reference.

For effective reverse engineering of an IC chip, one would use advance knowledge of the integrated circuit and devices therein to devise at least one electrical test vector for exercising and monitoring such an integrated circuit. Often, the test vector information is publicly available, such as in data sheets and other public documentation supplied by a manufacturer of the integrated circuit. The at least one test vector enables a test system to repeatedly run tests on an integrated circuit, such as by using an electrical circuit test generator. The test system exercises the integrated circuit and makes it operate thereby inducing light emissions from active elements in the circuit under test. The test system could be either an IC tester such as the Hewlett Packard Model 83000, or the actual circuitry in which the IC is designed to run. An example of such actual circuitry for a microprocessor could be the motherboard of a personal computer. Then, the PICA system can monitor and collect the light emissions from the integrated circuit under test as discussed below.

Figure 1:
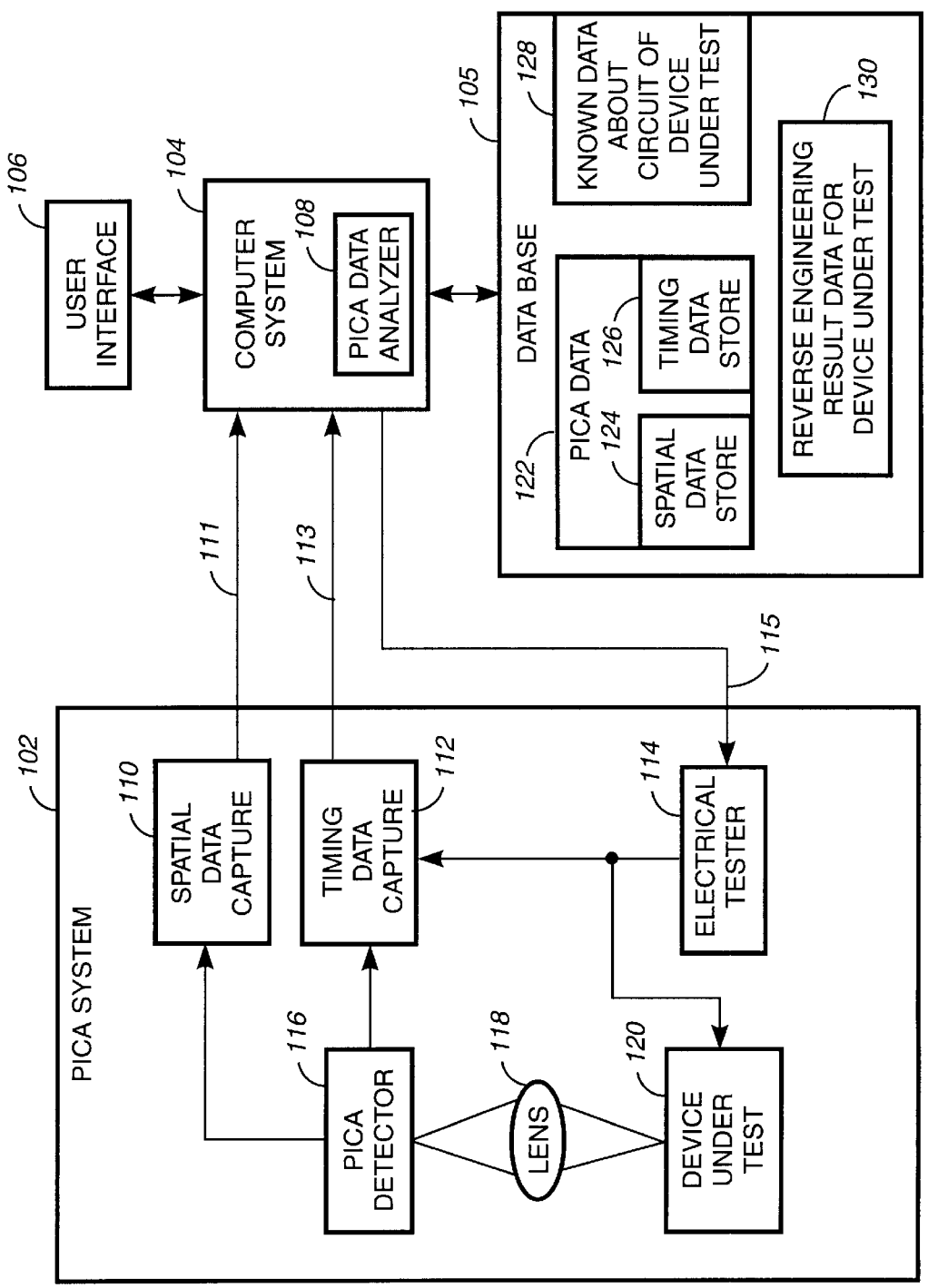
FIG. 1 is a block diagram of a reverse engineering system according to a preferred embodiment of the present invention.

A PICA system 102, as illustrated in an exemplary embodiment in FIG. 1, is an imaging system that simultaneously collects space and time information from every part of an IC chip so a monitoring system does not have to move from one device to another device in a circuit while collecting data. A monitoring system based on an electron beam (such as the Schlumberger ATE division model IDS10000) or on a laser beam (such as the Schlumberger ATE division model IDS2000), for example, may suffer from the disadvantage of monitoring (or viewing) circuit components one after another to reverse engineer the circuit. This, unfortunately, can result in a very time consuming process.

A PICA system 102 simultaneously collects data from all of the devices (circuit elements) in a circuit. Normally, optical emissions induced from devices in an IC chip are monitored across a planar view of the IC chip via a lens 118 and a PICA detector 116. Typically, spatial information is collected, by spatial data capture means 110, by using an X-Y grid to define a planar position in a viewing plane for light emissions. Time information is collected, by timing data capture means 112, by comparing occurrences of light emissions from devices in the circuit of the IC chip with a standard time base and a start reference signal that is normally injected into the IC chip to induce the light emissions. In some cases, the start reference signal may be self-generated by the IC chip. Using a PICA system to monitor time and space information of patterns of light emissions from devices in circuits in an IC chip under test can yield reliable and is efficient mapping out of such devices and circuit. Accordingly, a PICA system 102 facilitates reverse engineering of circuits in an IC chip, as will be discussed in more detail below.

Analysis of the data collected from the PICA system in conjunction with information already known and stored in memory 128 about the integrated circuit normally results in new information that is then additionally known and stored in memory 128 about the integrated circuit under test. This new information is additionally stored in the known information memory 128 to allow iterative reverse engineering of a circuit under test utilizing progressively more known information about the circuit under test. This progressive uncovering of information provides a process for reverse engineering circuits within an integrated circuit chip as will be discussed below.

A reverse engineering system, for example, captures the time based patterns of the optical pulses emitted upon injection of a signal, then followed by the optical emissions emitted, say, 50 or 100 picoseconds later, and then followed by a next set of patterns of optical emissions occurring at some time interval thereafter. By sampling at periodic time intervals, the reverse engineering system would time order the patterns of optical emissions being collected by the PICA system. This provides a set of patterns that can be compared against known reference patterns for known devices, etc., to assist in reconstructing a circuit model of devices in a circuit in an IC Chip.

As shown in FIG. 1, a user interface 106 coupled to a computer system provides output information to a user of the reverse engineering. Additionally, it can receive user input information to control the operations of the reverse engineering system. The user interface preferably includes a computer console and display to display information to the user. It additionally may include a keyboard to accept user input from the user.

Figure 2:
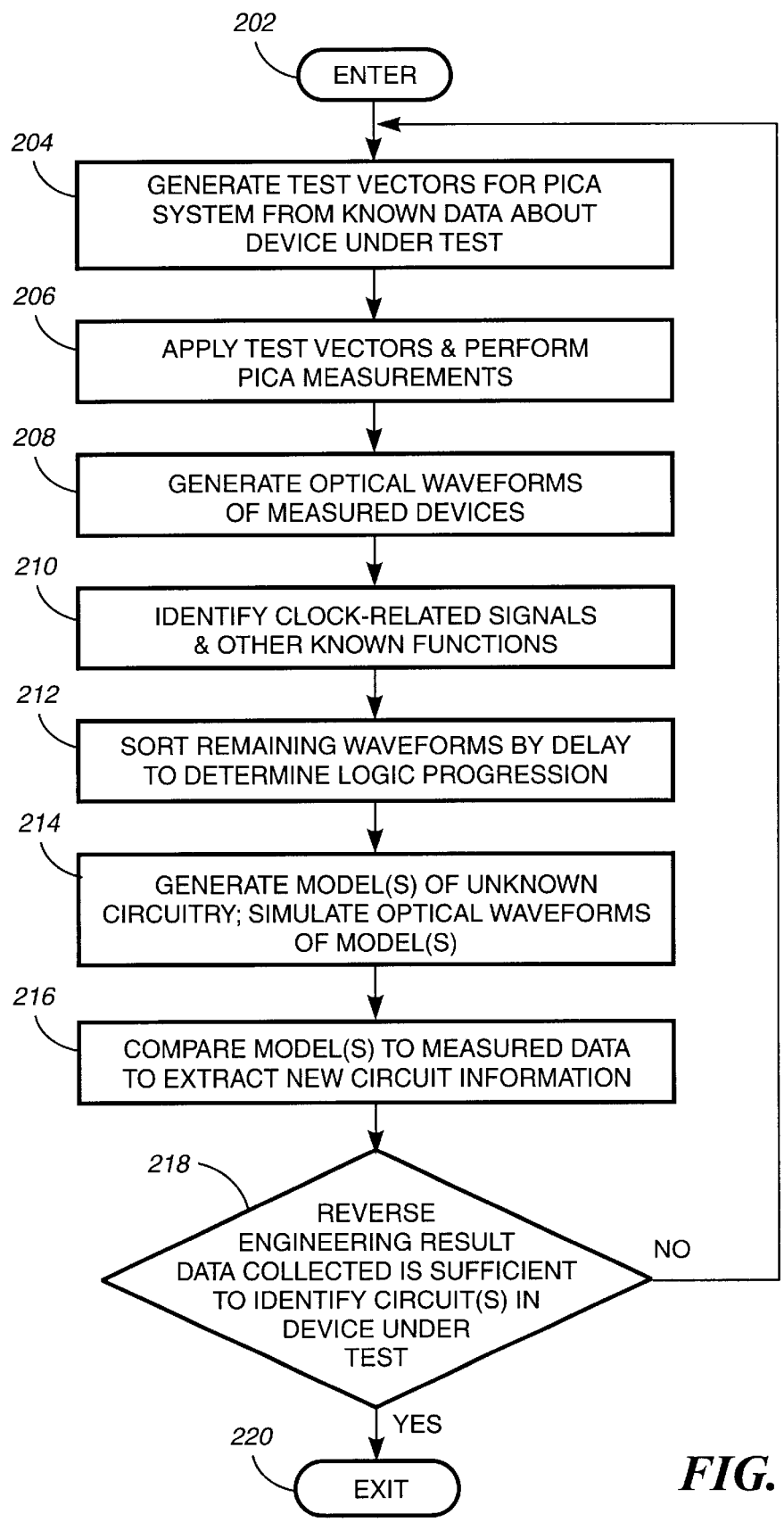
FIG. 2 is an operational flow diagram illustrating operations of the system of FIG. 1 according to a preferred embodiment of the present invention.

FIG. 2 illustrates an operational sequence for the exemplary reverse engineering system of FIG. 1. In this illustration, the reverse engineering method is iterative and utilizes collected reverse engineering result data to add it to the known information about a circuit under test, at step 218. This known information can be used in further reverse engineering of the circuit under test.

In a preferred embodiment of the present invention, the reverse engineering system can compare and attempt to match the monitored and captured patterns with known reference patterns, such as found in a database. These reference patterns represent circuit element models based on, for example, design data and/or empirical data that has been measured from representative devices. The latter models may comprise template pattern data for devices that have been measured using a PICA system.

The reverse engineering system typically compares a collected and measured pattern to a reference pattern to determine what a PICA emission pattern from a device, such as an inverter latch in the IC Chip, ought to look like. The reverse engineering system, in a preferred embodiment of the present invention, could then correlate which of the emission spots were caused by each of two candidate latches. Once the system determines the pattern for each latch it then could just count the number of latches. The reverse engineering system would determine the number of latches and whether the number was even or odd.

In a preferred embodiment, the reverse engineering system correlates the pattern of emissions that were sampled and measured from an IC Chip to a candidate reference model (profile) of what emission patterns for an inverter latch should look like. The reverse engineering system matches the sampled patterns of optical emissions to certain profiles of emissions that represent standard profiles, such as for an inverter latch, that are stored in a database in a computing system in the reverse engineering system.

If enough points in the sampled pattern match points in the stored reference pattern then the likelihood is that the measured sample matches the stored reference pattern, such as representing an inverter latch. On the other hand, if not enough points match between the sampled pattern and the current reference pattern, then the reverse engineering system would go to attempt to match a next likely device reference profile pattern stored in the database.

The reverse engineering system preferably includes a database of standard reference profiles for a number of circuit elements that are expected in a certain IC Chip or that would be likely in a certain IC Chip. The reverse engineering system utilizes the stored profiles of devices that are expected to be in a circuit in the IC Chip under test to attempt to create a model of the circuit. By using the PICA system to look at the layout of the circuit as indicated by optical emissions, for example, a series of latches may become visible to the PICA system. Such a series of latches may be optically recognized as some kind of a line of devices with a particular shape, e.g., a circuit segment of similar structures repeating several times, and representing, for example, several latches in a circuit. The layout of optical emissions indicates the series of latches. Using the PICA system the reverse engineering system collects the optical emissions from the circuit under test.

The PICA system, as discussed above, operates as an imaging system to simultaneously capture space and time information from every part of the IC Chip. Optical emissions from the IC Chip are monitored over a spatial grid over the IC Chip (space information) and across a number of defined time intervals (time information). The PICA System preferably utilizes an imaging photomultiplier tube to capture time and space patterns of optical emissions.

The PICA system can capture a snapshot in time with a pattern of optical emissions. This could be analogized to taking a still picture of a pattern of optical emissions at a point in time. A sequence of such snapshots can also be captured. This may be analogized to taking a movie of the optical emissions. Additionally, the PICA system can capture a time response for any plurality of pixels thereby capturing patterns over time. A time response from any such plurality of pixels is referred to as an optical waveform.

For example, a reverse engineering system can determine the location of an FET device, such as by the X-Y coordinates of optical emissions from the FET when monitoring a circuit in an IC Chip. Additionally, a time response of the light emissions from that FET can be monitored, such as by monitoring optical wave forms for each pixel in the pattern of light emissions from the FET. For example, these wave forms can indicate a series of states, e.g., ON-OFF, of an FET transistor switch.

The time response is measured against a triggering time base signal provided by electrical circuit tester 114 to the IC Chip under test. This external trigger signal is also provided from the circuit tester to the timing data capture means to synchronize the PICA system monitoring time base with the injection signal being provided to the IC Chip to exercise the circuit elements under test. The triggering signal indicates to the PICA system when the injection signal starts exercising the circuit in the IC Chip. This provides a time reference for measuring time intervals to capture the optical wave forms synchronized to a known time base.

The reverse engineering system typically repeats the circuit test many times, i.e., repeats the at least one test vector many times by repeatedly injecting the test signal into the IC Chip. This repeated circuit exercising allows monitoring of the light emissions of the devices in the circuit under test in response to a known injection signal. The PICA system in this way can capture the optical emissions and the reverse engineering system thereby creates a measured temporal and spatial profile of each of the devices in the circuit under test. After repeating the at least one test vector for many times, the PICA system has captured a profile of the optical emissions from each one of the transistors.

We will categorize reverse engineering into four classes as follows: (a) determining the physical locations of the subcircuits or circuit elements comprising the chip including the contents of various types of static memory circuits, (b) determining the logical functions and other functional characteristics of the subcircuits or circuit elements comprising the chip, (c) determining the device-level schematic of the transistors comprising each subcircuit or circuit element, and (d) determining the performance of the subcircuits or circuit elements). Specific examples are given below.

(a) Determining the physical locations of the subcircuits or circuit elements comprising the chip In an alternative exemplary method for reverse engineering a circuit in an IC chip, the locations of scan chain latch elements can be determined by operating the scan chains in flush mode, to see which circuit elements of the IC are active. The active elements will be readily identified by the presence of emission. In an iterative procedure, as in the flow chart of FIG. 2, after this first identification, the scan chains can then be operated in a clocked mode. The additional circuit elements with produce emission are then those related to the scan clock circuitry.

In designs that are found to not have a mode for flushing through the scan chains, the same net result can be obtained by first loading the scan chains with all zeros, applying zero to the scan inputs, and repeatedly scan clocking the latches while storing photon emission data, followed by loading the scan chains with alternating zeros and ones and repeatedly scanning alternating zeros and ones through the scan chains while storing photon emission data. Comparison of the two stored data files would reveal the clock circuits as emission patterns which did not change, and the scan latches as emission patterns which did change.

In another alternative exemplary method for reverse engineering a circuit in an IC Chip, the reverse engineering system can determine a clock signal distribution network across the IC Chip. This method is useful, for example, for determining major logic blocks within a chip that are usually all linked to a common clock signal. Most IC Chips have publicly available test vectors for powering and exercising the clock circuit for the IC Chip. This is a commonly available test vector to circuit designers. Once the clock power circuit is exercised by the circuit tester, the PICA system can monitor light emissions from across the IC Chip to identify the location of timing circuit elements across the IC Chip.

In a similar method to the above methods to identify the scan chain circuitry and clock circuit network, the connectivity of circuit elements to other circuit elements can be determined by exercising a target circuit element and seeing which other circuit elements are also active.

Furthermore, by time-ordering the emission pulses from the various connected circuit elements, it is possible to determine the progression of the connections from one circuit element to the next. In the above example of the scan chain operated in flush mode, the time ordering of the emission pulses from each scan latch determines unambiguously the ordering of the scan latches. In the case of the clock network, the time order determines the topology of the clock circuitry across the entire chip.

(b) Determining the logical functions and other functional characteristics of the subcircuits or circuit elements comprising the chip.

Figure 3:
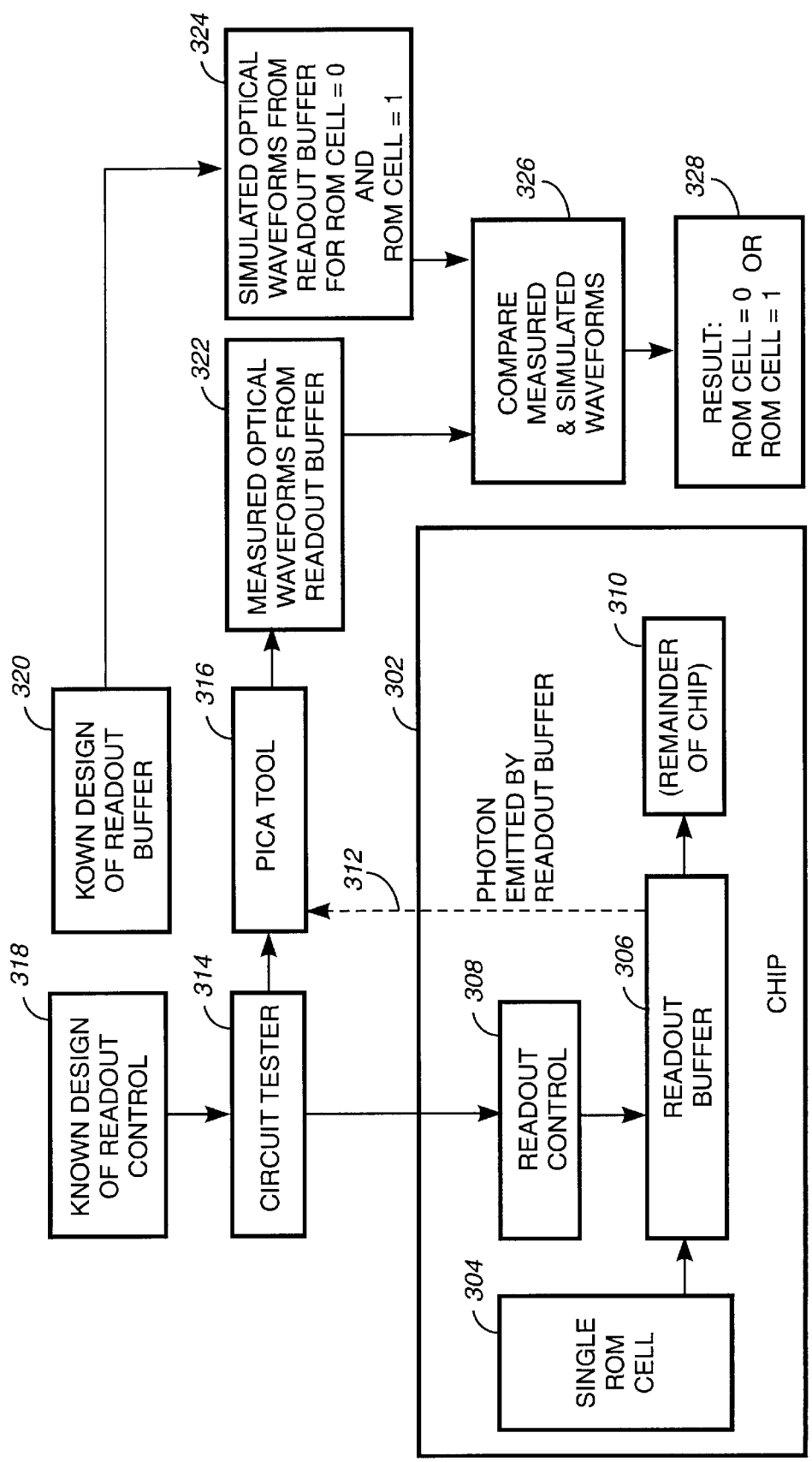
FIG. 3 is a data flow diagram showing an exemplary reverse engineering system operation in accordance with a preferred embodiment of the present invention.

In an alternative embodiment of the present invention, as illustrated in FIG. 3, the reverse engineering system can be used to reverse engineer the contents of a static memory device such as a read only memory. A memory read out circuit, for example, can be repeatedly exercised to read out the value of a memory cell. A test vector can be repeatedly executed by a circuit tester 314 to continuously and repeatedly read out the value of a memory cell in an IC.

The read out control circuit, in response to repeatedly reading out the value of a memory cell, repeatedly emits a pattern of light emissions that can be collected by the PICA system 316 to capture a profile of the read output of the memory cell. For example, the PICA system can determine the read output of a ROM cell. This creates a profile of the contents, or value, of the ROM cell by monitoring the light emissions therefrom during repeated read cycling of the output circuits of the ROM cell. The light emissions are collected with the PICA system 316 that is time synchronized to the circuit tester. The PICA system 316 in this way measures and profiles the wave forms from the ROM read out buffer.

If the design of the memory cell read out buffer is known and preferably can be exercised, then one can simulate what optical wave form would be expected for a ROM cell value equal to zero and similarly what optical wave form would be expected for a ROM cell value equal to one. Typically, a one to zero transition at the output of a readout buffer will produce a much larger pulse of optical emissions than a zero to one transition. By monitoring these transitions relative to a known time base the reverse engineering system can determine the value stored in the ROM. The reverse engineering system 102 would compute both simulations for zero-to-one and for one-to-zero transitions and would have them stored in a database as known profiles or templates. Then, the reverse engineering system would compare them to the "unknown" measured profile to determine which simulation matched a best fit to the pattern in the measured profile. The result 328 then would indicate whether a ROM cell was at the value of zero or at a value of one.

A discussion of a method for using a PICA system to deduce the value stored in a five bit counter was published in July, 1997 in a journal entitled "Electron Device Letters", in an article entitled "Dynamic Internal Testing of CMOS Circuits Using Hot Luminescence" by some of the inventors of the present invention. This published method by the present inventors is not an example of reverse engineering since the circuit design was already known. It is, however, an exemplary illustration of how PICA can be used to deduce a value temporarily stored in a counter circuit. FIG. 3 is a method outlining how to deduce a value permanently stored in a ROM circuit.

For example if a reverse engineering system did not know how to exercise a ROM device to read out a value from its buffer, the reverse engineering system might first apply a reverse engineering method as discussed above to determine the detailed information of devices in the readout buffer portion of the ROM device. Then, once the readout buffer is characterized and the circuit elements are determined and essentially "known" by the reverse engineering system, this known information can be used to exercise the readout control circuit of the readout buffer of the ROM to determine the value contained in the ROM. The reverse engineering process, therefore, can be an iterative process to progressively determine additional information about a circuit under test.

Other functional characteristics of a device may be reverse engineered in a similar manner. Examples include the ability to determine the sequence of operations taken to achieve a particular result. In a simple case it may be known that several operations and a particular number of clock cycles (or states in a state machine) are needed to achieve a particular result. The reverse engineering procedures described here may be used to determine the apportionment of the total number of clock cycles between the various operations needed to achieve the result. More specific examples follow.

Given a device that has already been reverse engineered and it is understood that a particular circuit performs an addition of two numbers, analysis of the light emission from the elements of the adder circuit over a period of time that includes several addition operations would reveal whether one add operation must be completed before another is started. By applying successive add operations to the device, measuring the location and time of light emitted from the adder elements, and comparing the start of one add operation to the end of the previous add operations, one could detect how many clock cycles were required to complete a single operation and how many add operations were started before completion of the first add operation (execution pipelining), or how many add operations were started between successive clock operations (wave pipelining).

In a similar fashion, if it were known that both an adder circuit and a divider circuit were on the device, then analysis of the time-domain results of the light emission could be used to determine if only one of these circuits could operate at one time or if both could be made to operate in parallel. This information is useful to quickly determine implementation details of a complex circuit that may not be easily determined from the circuit topologies. Examples of such implementation details include but are not limited to multiple operation dispatch and vector and super scalar implementations.

It is also useful to understand which operations on a chip are synchronized or not synchronized with other operations. One such example is cycle stealing, where a clock signal is delayed to one or more storage elements so that more computation may be achieved between clock cycle boundaries. Another example is an operation that completes in a multiple number of clock cycles without capturing the intermediate states of the operation in storage elements.

(c) Determining the device-level schematic of the transistors comprising each subcircuit For example, as a simple case, suppose an IC chip comprises a delay circuit, which includes an unknown number of inverters in an inverter chain. In this example, it may be desired to determine whether there is an even number or an odd number of inverters, and how many stages are in the delay circuit. Additionally, suppose one knew in advance how to inject a signal into this IC chip so that it would then propagate through this chain of inverters. Then, one could exercise the chain of inverters by propagating a signal through the chain, and by counting the subcircuits seen in the emission image directly determine the number of inverters in the chain.

Similarly, if a divide-by-n circuit was found on an IC, with n unknown, one can determine the value of n by time-resolving the emission from the circuit. The value of n is then the frequency of the emission pulses at the input to the circuit divided by the frequency at the output. Note that for this reverse engineering situation, the time resolution of the emission is essential.

(d) Determining the performance of the subcircuits or circuit elements

It is often useful to determine the performance of subcircuits as part of reverse engineering, so as to determine the ultimate capabilities of the circuit, such as speed, tolerance environmental conditions such as high temperature, and radio frequency interference immunity.

Returning again to the scan chain operated in flush mode, or a chain of inverters, by time-resolving the emission from the sequential scan latches or inverters, one can directly measure the latch-to-latch or inverter-to-inverter delay. (The measurement of inverter-to-inverter delays is disclosed in an article entitled "Dynamic Internal Testing of CMOS Circuits Using Hot Luminescence" by some of the inventors of the present invention.) An advantage of using time resolved emission over the conventional method, which is to simply measure the delay between the first and last element of the chain, is that the present method allows measurement of individual delays, instead of just the average delay, so that the variations around the average, as well as the average, can be seen. Since the ultimate speed of operation of the chain is determined by the slowest element, the ability to see the individual delays can be a significant improvement in reverse engineering the circuit as compared to measuring only the average.

Measurement such as those described in the previous paragraph can be made as a function of temperature or in the presence of strong radio frequency interference so as to determine the sensitivity of the individual circuit elements to these or other environmental influences.

The methods for the reverse engineering system taught herein provide significant advantages over any prior art reverse engineering methods. Specifically, the reverse engineering methods in accordance with the present invention are non-destructive. Therefore, these methods of reverse engineering do not impair the future operation of a circuit under test or destroy data stored in a static memory cell, so that the circuit may be operated after reverse engineering to conduct further testing. Additionally, these methods can be automatically implemented by a computing without significant manual intervention by technical personnel. These new methods significantly improve the efficiency and reliability of reverse engineering of IC Chips.

Although specific embodiments of the invention have been disclosed, it will be understood by those having skill in the art that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A reverse engineering system comprising:
   a PICA system for monitoring optical emissions from a circuit in an integrated circuit chip (IC chip) under test, the PICA system including
      an electrical circuit tester for injecting a triggering signal into the IC chip to exercise the circuit under test,
      a PICA detector; and
      a timing data capture means, electrically coupled to the electrical circuit tester and to the PICA detector, for capturing light emissions patterns from the circuit being exercised to collect space and time information from the circuit under test;
   a database memory including at least one reference pattern for comparing a captured light emission pattern thereto to identify at least one circuit element in the circuit under test; and
   a PICA data analyzer, electrically coupled to the database memory and to the PICA system, for determining whether the circuit under test comprises a circuit element with a light emission pattern that matches one of the at least one reference pattern in the database memory.

2. The reverse engineering system of claim 1, further comprising:
   a user interface, electrically coupled to the PICA data analyzer, to provide information to a user of the reverse engineering system to indicate to the user whether the circuit under test comprises a circuit element matching one of the at least one reference pattern in the database memory.

3. The reverse engineering system of claim 1, wherein the database memory includes a memory for storing known information about the circuit under test, and wherein the PICA data analyzer utilizes the known information stored in the database memory in conjunction with the captured pattern of light emissions from the PICA detector to determine whether the circuit element matches one of the at least one reference pattern in the database memory.

4. The reverse engineering system of claim 3, wherein the PICA analyzer utilizes an iterative reverse engineering of the IC chip under test by storing captured pattern information and match determination information in the memory for storing known information about the circuit under test, to use the known information in a subsequent reverse engineering of the IC chip.

5. The system of claim 1, wherein the reverse engineering system reverse engineers the circuit under test to determine whether a circuit element under test matches a known reference pattern stored in the database to indicate at least one of
   1) detection of a circuit element in the circuit under test;
   2) detection of a value stored in a memory in the circuit under test; and
   3) detection of a timing network topology in the IC chip.

6. A method for reverse engineering a circuit in an integrated circuit chip, the method comprising:
   monitoring optical emissions from a circuit in an integrated circuit chip (IC chip) under test;
   injecting a triggering signal into the IC chip to exercise the circuit under test;
   capturing light emissions patterns from the circuit being exercised to collect space and time information from the circuit under test; and
   determining whether the circuit under test comprises a circuit element with a light emission pattern that matches one of at least one known reference pattern associated with a known circuit element.

7. The method of claim 6 wherein the match with the reference pattern indicates at least one of a value stored in a memory in the IC chip, and a known circuit element is found in the circuit under test.

8. A method for reverse engineering a circuit in an integrated circuit chip, the method comprising:
   monitoring optical emissions from a circuit in an integrated circuit chip (IC chip) under test
   injecting a triggering signal into the IC chip to exercise the circuit under test;
   capturing light emissions patterns from the circuit being exercised to collect space and time information from the circuit under test;
   comparing a captured light emission pattern from the circuit under test to at least one light emission pattern stored in a database each of the at least one light emission pattern stored in the database being associated with a known circuit element; and
   identifying an at least partially unknown circuit element in the circuit under test by determining whether the captured light emission pattern matches one of the at least one light emission pattern stored in the database and being associated with a known circuit element.

* * * * *

UNITED STATES PATENT AND TRADEMARK OFFICE
CERTIFICATE OF CORRECTION

PATENT NO. : 6,496,022 B1
DATED : December 17, 2002
INVENTOR(S) : Kash et al.

It is certified that error appears in the above-identified patent and that said Letters Patent is hereby corrected as shown below:

<u>Title page,</u>
Item [74], *Attorney, Agent, or Firm*, from "GIbbons" to -- Gibbons --

<u>Column 10,</u>
Line 33, from "a light" to -- a captured light --

Signed and Sealed this

Thirteenth Day of May, 2003

JAMES E. ROGAN
*Director of the United States Patent and Trademark Office*